United States Patent
Lin et al.

(10) Patent No.: US 8,369,479 B2
(45) Date of Patent: Feb. 5, 2013

(54) SHIFT REGISTER WITH EMBEDDED BIDIRECTIONAL SCANNING FUNCTION

(75) Inventors: Ching-Huan Lin, Hsinchu (TW);
Sheng-Chao Liu, Hsinchu (TW);
Kuan-Chun Huang, Hsinchu (TW);
Chih-Hung Shih, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 59 days.

(21) Appl. No.: 13/196,322

(22) Filed: Aug. 2, 2011

(65) Prior Publication Data

US 2011/0286571 A1    Nov. 24, 2011

Related U.S. Application Data

(60) Division of application No. 12/777,845, filed on May 11, 2010, now Pat. No. 8,023,611, and a continuation-in-part of application No. 12/212,143, filed on Sep. 17, 2008, now abandoned.

(51) Int. Cl.
*G11C 19/00* (2006.01)

(52) U.S. Cl. ............... 377/64; 377/74; 377/69; 377/77; 377/79

(58) Field of Classification Search ............ None
See application file for complete search history.

(56) References Cited

U.S. PATENT DOCUMENTS

| | | | |
|---|---|---|---|
| 5,894,296 A | 4/1999 | Maekawa | |
| 6,232,939 B1 | 5/2001 | Saito et al. | |
| 6,765,980 B2 * | 7/2004 | Azuma et al. | 377/69 |
| 6,788,757 B1 * | 9/2004 | Lu et al. | 377/69 |
| 6,813,331 B1 | 11/2004 | Yu et al. | |
| 6,937,687 B2 | 8/2005 | Yu | |
| 6,970,530 B1 | 11/2005 | Wang et al. | |
| 7,106,292 B2 | 9/2006 | Moon | |
| 7,327,161 B2 * | 2/2008 | Jang et al. | 326/46 |
| 7,397,885 B2 | 7/2008 | Moon et al. | |
| 7,573,972 B2 | 8/2009 | Chen | |
| 2004/0125069 A1 * | 7/2004 | Park et al. | 345/100 |
| 2006/0256066 A1 | 11/2006 | Moon | |
| 2007/0248204 A1 | 10/2007 | Tobita | |
| 2007/0274433 A1 | 11/2007 | Tobita | |
| 2008/0012818 A1 | 1/2008 | Lee et al. | |
| 2008/0187089 A1 | 8/2008 | Miyayama et al. | |
| 2008/0219401 A1 | 9/2008 | Tobita | |
| 2009/0052327 A1 | 2/2009 | Larsson et al. | |
| 2009/0080593 A1 * | 3/2009 | Kim et al. | 377/75 |
| 2010/0067646 A1 | 3/2010 | Liu et al. | |

FOREIGN PATENT DOCUMENTS

| | | |
|---|---|---|
| JP | 11202295 A | 7/1999 |
| JP | 2005025151 A | 1/2005 |
| TW | 200709169 | 3/2007 |

* cited by examiner

*Primary Examiner* — Tuan T Lam
(74) *Attorney, Agent, or Firm* — Morris Manning & Martin LLP; Tim Tingkang Xia, Esq.

(57) ABSTRACT

The present invention relates to a shift register having a plurality of stages electrically coupled to each other in series. Each stage includes a first and second TFT transistor. The first TFT transistor has a get electrically coupled to the output of the immediately prior stage, a drain electrically coupled to the boost point of the stage, and a source configured to receive one of the first and second control signals. The second TFT transistor has a get electrically coupled to the output of the immediately next stage, a drain and a source electrically coupled the drain and the source of the first transistor, respectively.

11 Claims, 7 Drawing Sheets

SHIFT REGISTER WITH EMBEDDED BIDIRECTIONAL SCANNING FUNCTION

CROSS-REFERENCE TO RELATED PATENT APPLICATION

This application is a divisional application of U.S. patent application Ser. No. 12/777,845, filed May 11, 2010, now U.S. Pat. No. 8,023,611 entitled "A SHIFT REGISTER WITH EMBEDDED BIDIRECTIONAL SCANNING FUNCTION" by Ching-Huan Lin et al., which itself is a continuation-in-part of U.S. patent application Ser. No. 12/212,143, filed Sep. 17, 2008, now abandoned entitled "A SHIFT REGISTER WITH EMBEDDED BIDIRECTIONAL SCANNING FUNCTION" by Kuang-Hsinag Liu et al., the disclosure of the above identified applications are incorporated herein by reference in their entirety.

Some references, if any, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present invention relates generally to a shift register and more particularly to a shift register with an embedded bidirectional scanning function.

BACKGROUND OF THE INVENTION

A liquid crystal display (LCD) includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a bi-directional shift register is usually utilized in the gate driver to generate the plurality of gate signals for sequentially driving the gate lines, so as to allow a positive or a reverse display image. Typically, a plurality of 2- to-2 bi-directional control circuits is employed in the bi-directional shift register to control the scanning direction, forward or backward, of the plurality of gate signals.

FIG. 7 illustrates a conventional 2- to-2 bi-directional control circuit having two input terminals P and N, and two output terminals D1 and D2, and is operably controlled by two control signals Bi and XBi. The control signals Bi and XBi are two DC signals set to have opposite polarities, such as a high level voltage and a low level voltage, and used to set the 2- to 2 bi-directional control circuits in a manner to direct input signals in the shift register to be shifted in a forward or backward direction. However, the use of the 2- to 2 bi-directional control circuit in each stage of the shift register may cause voltage drops in input signals of the stage, and increase power consumption and manufacture costs.

Therefore, a heretofore unaddressed need exists in the art to address the aforementioned deficiencies and inadequacies.

SUMMARY OF THE INVENTION

The present invention, in one aspect, relates to a shift register. In one embodiment, the shift register includes a first control line for providing a first control signal, Bi1; a second control line for providing a second control signal, Bi2; a first clock signal line for providing a first clock signal, CK; a second clock signal line for providing a second clock signal, XCK; a reference line for providing a reference voltage, VSS; and a plurality of stages, $\{S_j\}$, j=1, 2, . . . , N, N being a positive integer, electrically coupled to each other in series.

Each stage $S_j$ includes an output for outputting a scanning signal, g(j); a first transistor M1 having a gate electrically coupled to the output of the immediately prior stage $S_{j-1}$, a drain electrically coupled to the node BP, and a source electrically coupled to one of the first and second control signal lines for receiving a corresponding control signal therefrom, respectively; a second transistor M2 having a gate electrically coupled to the output of the immediately next stage $S_{j+1}$, a drain electrically coupled to the drain of the first transistor M1, and a source electrically coupled to the source of the first transistor M1, respectively; a third transistor M3 having a gate electrically coupled to the node BP, a drain electrically coupled to one of the first and second clock signal lines for receiving a corresponding clock signal therefrom, and a source electrically coupled to the output, respectively; and a fourth transistor M4 having a gate, a drain electrically coupled to the source of the third transistor M3, and a source electrically coupled to the reference signal line for receiving the reference voltage therefrom, respectively.

Further, each stage $S_j$ also includes a disable circuit electrically coupled between the node BP and the gate of the fourth transistor M4 for operably disabling an output of the stage $S_j$.

In one embodiment, the source of the first transistor M1 of the stage $S_j$ and the source of the first transistor M1 of the stage $S_{j+1}$ are electrically coupled to one of the first and second control signal lines, while the source of the first transistor M1 of the stage $S_{j+2}$ and the source of the first transistor M1 of the stage $S_{j+3}$ are electrically coupled to the other of the first and second control signal lines. The drain of the third transistor M3 of the stage $S_j$ is electrically coupled to one of the first and second clock signal lines when j is an odd number, while the drain of the third transistor M3 of the stage $S_j$ is electrically coupled to the other of the first and second clock signal lines when j is an even number.

Each of the first control signal Bi1, the second control signal Bi2, the first clock signal CK and the second clock signal XCK is characterized with a period and a phase, wherein the periods of the first and second control signals Bi1 and Bi2 are identical and the phases of the first and second control signals Bi1 and Bi2 are opposite to each other, wherein the periods of the first and second clock signals CK and XCK are identical and the phases of the first and second clock signals CK and XCK are opposite to each other. In one embodiment, the periods of the first and second control signals Bi1 and Bi2 are (2*B*T), and the periods of the first and second clock signals CK and XCK are (2*C*T), and wherein T is a pulse width of the scanning signal g(j), and B and C are constants satisfying the relationship of B=2*C.

In one embodiment, the first control signal Bi1 and the first clock signal CK have a relative phase that controls input signals to be shifted in a forward or backward direction.

In one embodiment, each of the first transistor M1, the second transistor M2, the third transistor M3, and the fourth transistor M4 comprises a field-effect thin film transistor.

In another aspect, the present invention relates to a shift register. In one embodiment, the shift register comprises a first shift register circuit and second shift register circuit that in use, are formed on the left and right sides, respectively, of a display panel such that a pixel matrix of the display panel is located between the first and second GOA shift register circuits.

Each of the first and second shift register circuits includes a first control line for providing a first control signal, Bi1_L/Bi1_R; a second control line for providing a second control signal, Bi2_L/Bi2_R; a first clock signal line for providing a first clock signal, CK_L/CK_R; a second clock signal line for providing a second clock signal, XCK_L/XCK_R; a reference line for providing a reference voltage, VSS; and a plurality of stages, $\{S_j\}$, $j=1, 2, \ldots, N$, N being a positive integer, electrically coupled to each other in series.

Each stage $S_j$ includes an output for outputting a scanning signal, $g(j)\_L/g(j)\_R$; a first transistor M1 having a gate electrically coupled to the output of the immediately prior stage $S_{j-1}$, a drain electrically coupled to the node BP, and a source electrically coupled to one of the first and second control signal lines for receiving a corresponding control signal therefrom, respectively; a second transistor M2 having a gate electrically coupled to the output of the immediately next stage $S_{j+1}$, a drain electrically coupled to the drain of the first transistor M1, and a source electrically coupled to the source of the first transistor M1, respectively; a third transistor M3 having a gate electrically coupled to the node BP, a drain electrically coupled to one of the first and second clock signal lines for receiving a corresponding clock signal therefrom, and a source electrically coupled to the output, respectively; and a fourth transistor M4 having a gate, a drain electrically coupled to the source of the third transistor M3, and a source electrically coupled to the reference signal line for receiving the reference voltage therefrom, respectively. Each of the first transistor M1, the second transistor M2, the third transistor M3, and the fourth transistor M4 comprises a field-effect thin film transistor.

In one embodiment, each $S_j$ further comprises a disable circuit electrically coupled between the node BP and the gate of the fourth transistor M4 for operably disabling an output of the stage $S_j$.

The scanning signals, $\{g(j)\_L\}$, output sequentially from the first shift register circuit are operably applied to the odd number rows of the pixel matrix, respectively, while the scanning signals, $\{g(j)\_R\}$, output sequentially from the second GOA shift register circuit are operably applied to the even number rows of the pixel matrix, respectively, or vice versa.

For each shift register circuit, the source of the first transistor M1 of the stage $S_j$ and the source of the first transistor M1 of the stage $S_{j+1}$ are electrically coupled to one of the first and second control signal lines, while the source of the first transistor M1 of the stage $S_{j+2}$ and the source of the first transistor M1 of the stage $S_{j+3}$ are electrically coupled to the other of the first and second control signal lines.

For each shift register circuit, the drain of the third transistor M3 of the stage $S_j$ is electrically coupled to one of the first and second clock signal lines when j is an odd number, while the drain of the third transistor M3 of the stage $S_j$ is electrically coupled to the other of the first and second clock signal lines when j is an even number.

For each shift register circuit, each of the first control signal Bi1_L/Bi1_R, the second control signal Bi2_L/Bi2_R, the first clock signal CK_L/CK_R and the second clock signal XCK_L/XCK_R is characterized with a period and a phase, wherein the periods of the first and second control signals Bi1_L/Bi1_R and Bi2_L/Bi2_R are identical and the phases of the first and second control signals Bi1_L/Bi1_R and Bi2_L/Bi2_R are opposite to each other, wherein the periods of the first and second clock signals CK_L/CK_R and XCK_L/XCK_R are identical and the phases of the first and second clock signals CK_L/CK_R and XCK_L/XCK_R are opposite to each other. In one embodiment, the periods of the first and second control signals Bi1_L/Bi1_R and Bi2_L/Bi2 are $(2*B*T)$, and the periods of the first and second clock signals CK_L/CK_R and XCK_L/XCK_R are $(2*C*T)$, and wherein T is a pulse width of the scanning signal $g(j)\_L/g(j)\_R$, and B and C are constants satisfying the relationship of $B=2*C$.

In one embodiment, the first control signal Bi1_L/Bi1_R, the second control signal Bi2_L/Bi2_R, the first clock signal CK_L/CK_R and the second clock signal XCK_L/XCK_R have a relative phase that controls input signals to be shifted in a forward or backward direction.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
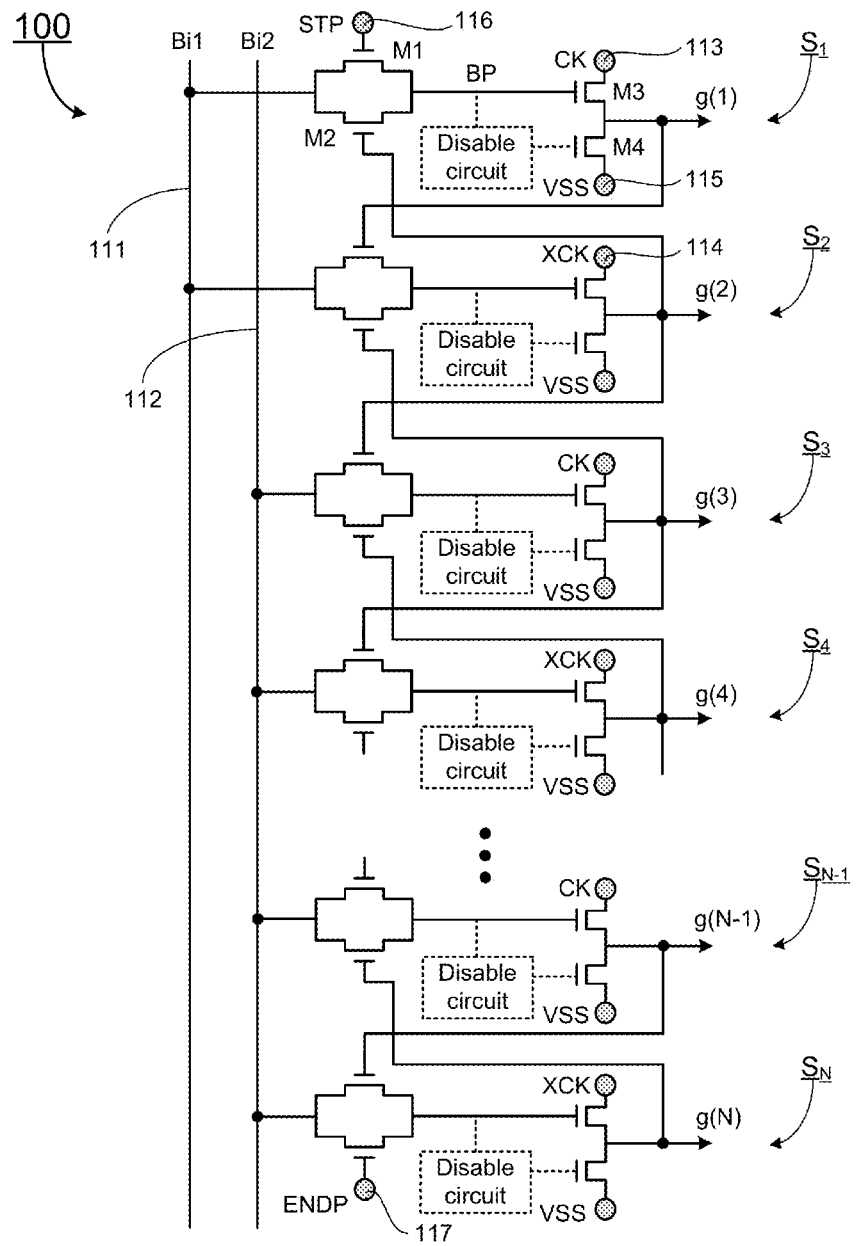
FIG. 1 shows a shift register according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to a shift register with embedded bidirectional scanning function.

Figure 2:
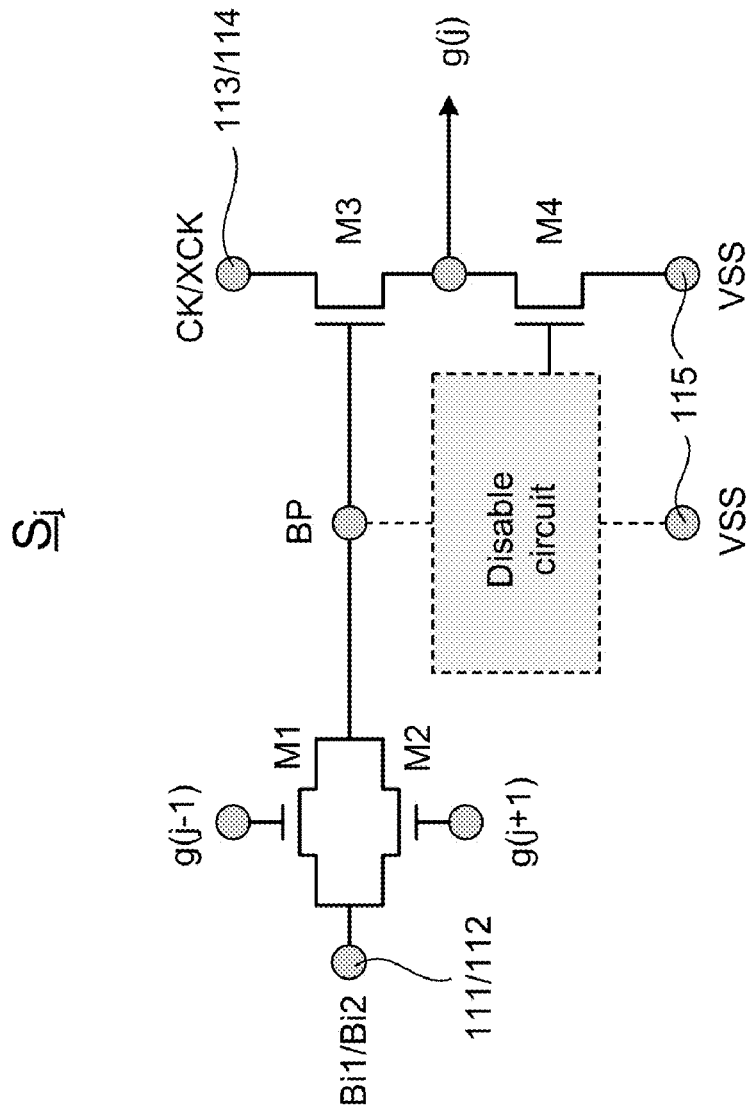
FIG. 2 shows a circuit diagram of a stage of the shift register shown in FIG. 1.

Referring to FIGS. 1 and 2, and in particular to FIG. 1, a shift register 100 is shown according to one embodiment of the present invention. The shift register 100 includes a first control line 111 for providing a first control signal, Bi1, a second control line 112 for providing a second control signal, Bi2, a first clock signal line 113 for providing a first clock signal, CK, a second clock signal line 114 for providing a second clock signal, XCK, a reference line 115 for providing a reference voltage, VSS, and a plurality of stages, $\{S_j\}$, j=1, 2, . . . , N, N being a positive integer, electrically coupled to each other in series. Further, the shift register 100 also includes a first start pulse input line 116 for providing a first start pulse, STP, and a second pulse input line 117 for providing a second start pulse, ENDP. The first start pulse STP servers as a start pulse signal in a forward function operation of the shift register 100, and the second start pulse ENDP servers as a start pulse signal in a backward function operation of the shift register 100.

The first control line 111, the second control line 112, the first clock signal line 113, the second clock signal line 114, and the reference line 115 constitute a data bus formed on the periphery of a substrate of a display panel (not shown). The plurality of stages, $\{S_j\}$ is also formed on the substrate adjacent to the data bus. The data bus may also include the first and second pulse input lines 116 and 117. In one embodiment, the first and second pulse input lines 116 and 117 may correspond to first and second dummy circuits/stages for generating the first and second start pulses STP and ENDP, respectively.

As shown in FIG. 2, each stage $S_j$ includes an output for outputting a scanning signal, g(j), and first to fourth transistors M1-M4. The first to fourth transistors M1-M4 are field-effect thin film transistors or the like.

The first transistor M1 has a gate electrically coupled to the output of the immediately prior stage $S_{j-1}$ for receiving the output scanning signal g(j−1) therefrom, a drain electrically coupled to the node BP, and a source electrically coupled to one of the first and second control signal lines 111 and 112 for receiving a corresponding control signal Bi1/Bi2 therefrom, respectively.

The second transistor M2 has a gate electrically coupled to the output of the immediately next stage $S_{j+1}$ for receiving the output scanning signal g(j+1) therefrom, a drain electrically coupled to the drain of the first transistor M1, and a source electrically coupled to the source of the first transistor M1, respectively.

The third transistor M3 has a gate electrically coupled to the node BP, a drain electrically coupled to one of the first and second clock signal lines 113 and 114 for receiving a corresponding clock signal CK/XCK therefrom, and a source electrically coupled to the output for outputting the scanning signal g(j) of the stage $S_j$, respectively.

The fourth transistor M4 has a gate, a drain electrically coupled to the source of the third transistor M3, and a source electrically coupled to the reference signal line 115 for receiving the reference voltage VSS therefrom, respectively.

For the first stage $S_1$, the gate of the first transistor M1 is electrically coupled to the first start pulse input line 116 for receiving the first start pulse STP therefrom. For the very last, N-th stage $S_N$, the gate of the second transistor M2 is electrically coupled to the second start pulse input line 117 for receiving the second start pulse ENDP therefrom.

Further, each stage $S_j$ (j=1, 2, 3, . . . , N) also includes a disable circuit electrically coupled between the node BP, the reference signal line 115 and the gate of the fourth transistor M4. The disable circuit is configured operably to generate one or more signals responsive to the input pulses so as to disable the shifter register when an abnormal state occurs.

As shown in FIG. 1, in this exemplary embodiment, the source of the first transistor M1 of the first stage $S_j$ and the source of the first transistor M1 of the second stage $S_2$ are electrically coupled to the first control signal line 111 for receiving the first control signal Bi1 therefrom, while the source of the first transistor M1 of the third stage $S_3$ and the source of the first transistor M1 of the fourth stage $S_4$ are electrically coupled to the second control signal line 112 for receiving the second control signal Bi2 therefrom. Generally, the sources of the first transistors M1 of each two adjacent stages $S_k$ and $S_{k+1}$ are electrically coupled to one of the first and second control signal lines 111 and 112 for receiving the corresponding control signal Bi1/Bi2 therefrom, and the sources of the first transistors M1 of each next two adjacent stages $S_{k+2}$ and $S_{k+3}$ are electrically coupled to the other of the first and second control signal lines 111 and 112 for receiving the corresponding control signal Bi1/Bi2 therefrom, where k=1, 5, 9, . . . , (N−4).

The drain of the third transistor M3 of the first stage $S_1$ is electrically coupled to the first clock signal line for receiving the first clock signal CK therefrom, and the drain of the third transistor M3 of the second stage $S_2$ is electrically coupled to the second clock signal line for receiving the second clock signal XCK therefrom. Generally, the drain of the third transistor M3 of the stage $S_j$ is electrically coupled to one of the first and second clock signal lines when j is an odd number, while the drain of the third transistor M3 of the stage $S_j$ is electrically coupled to the other of the first and second clock signal lines when j is an even number.

An operation procedure of the shift register 100 is described with reference to the stage circuit shown in FIGS. 1 and 2 and the driving waveforms (timing charts) illustrated in FIGS. 3 and 4. For such a configuration of the shift register, the forward and backward shift directions of a pulse signal can be controlled by the relative phase or timing order between the first control signal Bi1 and the first clock signal CK.

In this exemplary embodiment, each of the first control signal Bi1, the second control signal Bi2, the first clock signal CK and the second clock signal XCK is characterized with a period and a phase. The periods of the first and second control signals Bi1 and Bi2 are identical, as indicated by $T_B$, while the phases of the first and second control signals Bi1 and Bi2 are opposite to each other. Further, the periods of the first and second clock signals CK and XCK are identical, as indicated by $T_C$, while the phases of the first and second clock signals CK and XCK are opposite to each other. According to the present invention, $T_B=(2*B*T)$ and $T_C=(2*C*T)$, where T is a pulse width of the scanning signal g(j), or the start pulse STP/ENDP, and B and C are constants satisfying the relationship of B=2*C. Preferably, C=1.

Figure 3:
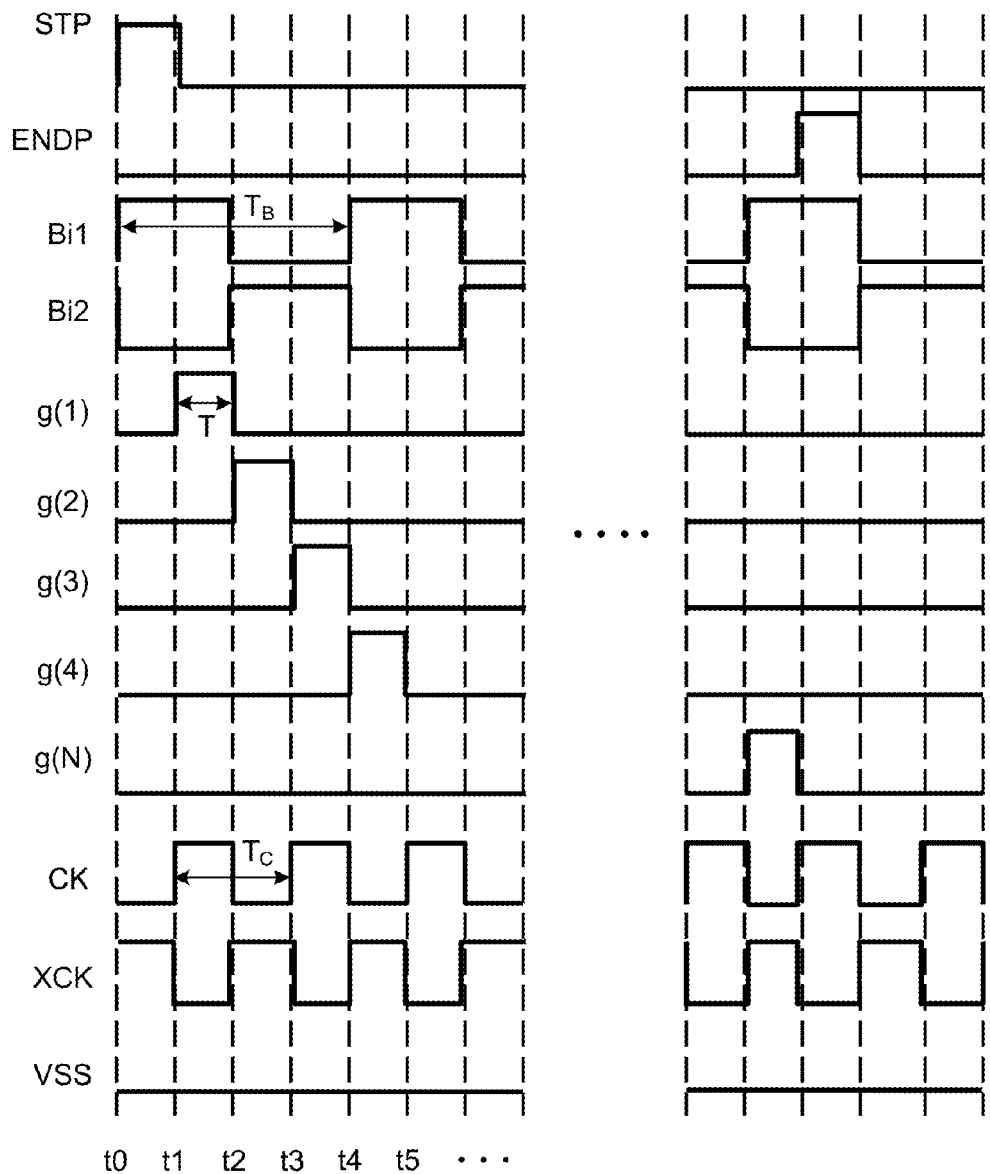
FIG. 3 shows a timing chart of input and output signals of the shift register shown in FIG. 1.
Figure 4:
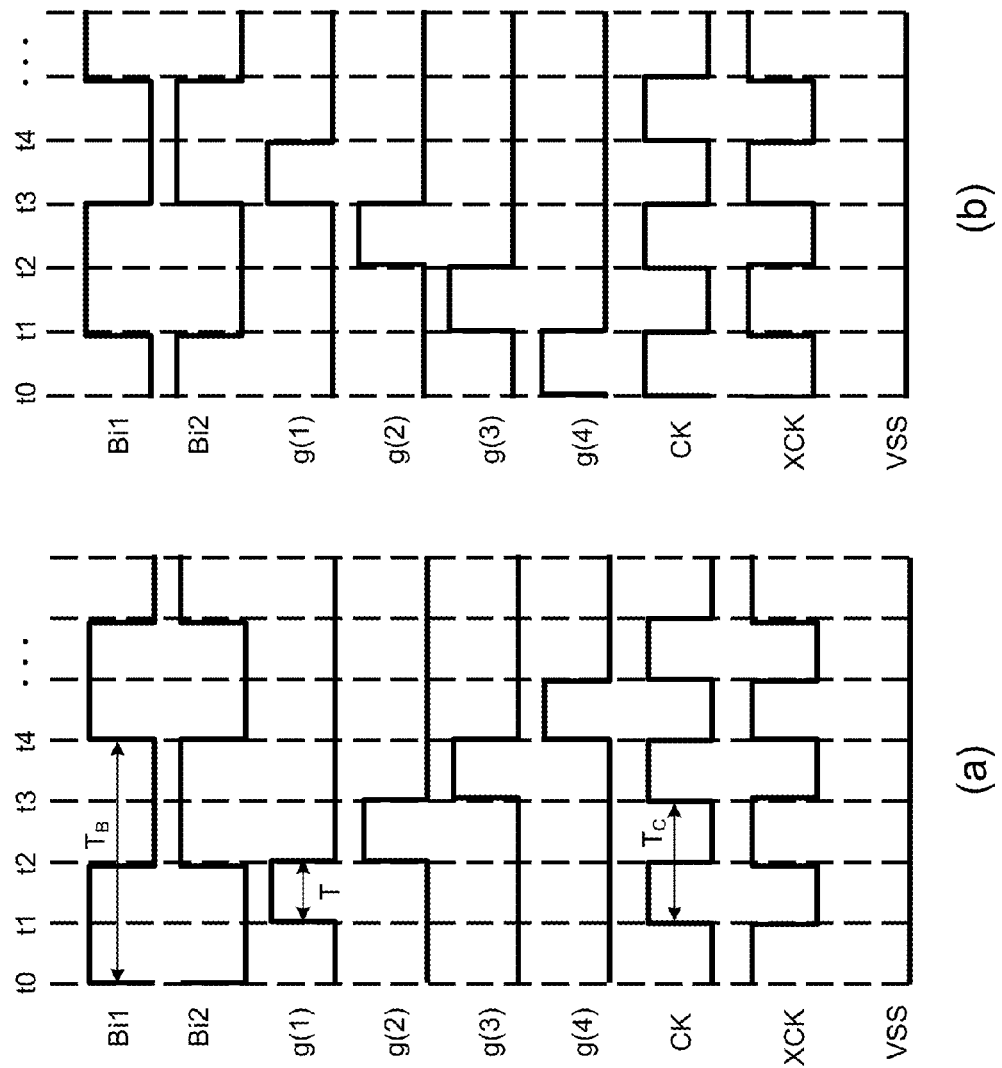
FIG. 4 shows another timing chart of input and output signals of the shift register shown in FIG. 1.

FIGS. 3 and 4(a) show the timing charts of the signals of the shift register in the forward function operation.

At first, during the time period of (t1-t0), the start pulse STP having a high level voltage from time t0 to t1 is applied to the gate of the first transistor M1 of the first stage $S_1$. Accordingly, the first transistor M1 of the first stage $S_1$ is turned on, and the boost point BP is charged by the high level voltage of the first control signal Bi1, which, in turn, turns on the third transistor M3. However, the first clock signal CK at the time period is in its low level voltage. Thus, the output signal g(1) of the first stage $S_1$ is in the low level voltage, or no signal pulse is output from the first stage.

During the time period of (t2-t1), the third transistor M3 of the first stage $S_1$ is still turned on because of the voltage level charged in the boost point BP. Accordingly, the output signal g(1) of the first stage $S_1$ has a pulse that is corresponding to the pulse of the first clock signal CK. Meanwhile, the output pulse g(1) from the first stage $S_1$ is applied to the gate of the first transistor M1 of the second stage $S_2$. As a result, the first transistor M1 is turned on, and the boost point BP is charged by the high level voltage of the first control signal Bi1, which, in turn, turns on the third transistor M3 of the second stage $S_2$. However, the second clock signal XCK at the time period is in its low level voltage. Thus, the output signal g(2) of the second stage $S_2$ is in the low level voltage, or no signal pulse is output from the second stage $S_2$.

During the time period of (t3-t2), the third transistor M3 of the second stage $S_2$ is still turned on because of the voltage level charged in the boost point BP. Accordingly, the output signal g(2) of the second stage $S_2$ has a pulse that is corresponding to the pulse of the second clock signal XCK. Meanwhile, the output pulse g(2) from the second stage $S_2$ is applied to the gate of the first transistor M1 of the third stage $S_3$. As a result, the first transistor M1 is turned on, and the boost point BP is charged by the high level voltage of the second control signal Bi2, which, in turn, turns on the third transistor M3 of the third stage $S_3$. However, the first clock signal CK at the time period is in its low level voltage. Thus, the output signal g(3) of the third stage $S_3$ is in the low level voltage, or no signal pulse is output from the third stage $S_3$.

Similarly, during the time period of (t4-t3), the third stage $S_3$ outputs a signal g(3) having a pulse corresponding to the pulse of the first clock signal CK; during the time period of (t5-t4), the fourth stage $S_4$ outputs a signal g(4) having a pulse corresponding to the pulse of the second clock signal XCK; and so on. Each of the output pulses, g(1), g(2), g(3), g(4), ..., and g(N) is sequentially shifted in the forward shift direction by one clock. The M4 is turned on by the signal from the disable circuit to help keeping g(N) at the voltage value VSS, which can be low voltage part of the first and second clock signals CK or XCK, except during the time period of the gate pulse output.

In the backward function operation, the start pulse ENDP is shifted from the N-th stage $S_N$ to the first stage $S_1$ by control the timing relations/orders of the signals CK, XCK, Bi1 and Bi2. FIG. 4(b) shows the timing charts of the signals of the shift register in the backward function operation, where the signal shifting starts from, for example, the pulse of the output signal g(4) of the fourth stage $S_4$, which has a high level voltage pulse from time t0 to t1. When the output signal g(4) of the fourth stage $S_4$ is applied to the gate of the second transistor M2 of the third stage $S_3$, it turns on the second transistor M2 is turned on during the time period of (t1-t0). Consequently, the boost point BP is charged by the high level voltage of the second control signal Bi2, which, in turn, turns on the third transistor M3 of the third stage $S_3$. However, the first clock signal CK at the time period is in its low level voltage. Thus, the output signal g(3) of the third stage $S_3$ is in the low level voltage, or no signal pulse is output from the third stage $S_3$ during the time period of (t1-t0).

During the time period of (t2-t1), the third transistor M3 of the third stage $S_3$ is still turned on because of the voltage level charged in the boost point BP. Accordingly, the output signal g(3) of the third stage $S_3$ has a pulse that is corresponding to the pulse of the second clock signal XCK. Meanwhile, the output pulse g(3) from the third stage $S_3$ is applied to the gate of the first transistor M1 of the second stage $S_2$. As a result, the first transistor M1 is turned on, and the boost point BP is charged by the high level voltage of the second control signal Bi1, which, in turn, turns on the third transistor M3 of the second stage $S_2$. However, the first clock signal CK at the time period is in its low level voltage. Thus, the output signal g(2) of the second stage $S_2$ is in the low level voltage, or no signal pulse is output from the third stage $S_2$.

Similarly, during the time period of (t3-t2), the second stage $S_2$ outputs a signal g(2) having a pulse corresponding to the pulse of the first clock signal CK; during the time period of (t4-t3), the first stage $S_1$ outputs a signal g(1) having a pulse corresponding to the pulse of the second clock signal XCK; and so on. Each of the output pulses, g(N), g(N−1), g(N−2), g(N−3), ..., and g(1) is sequentially shifted in the backward shift direction by one clock.

Figure 5:
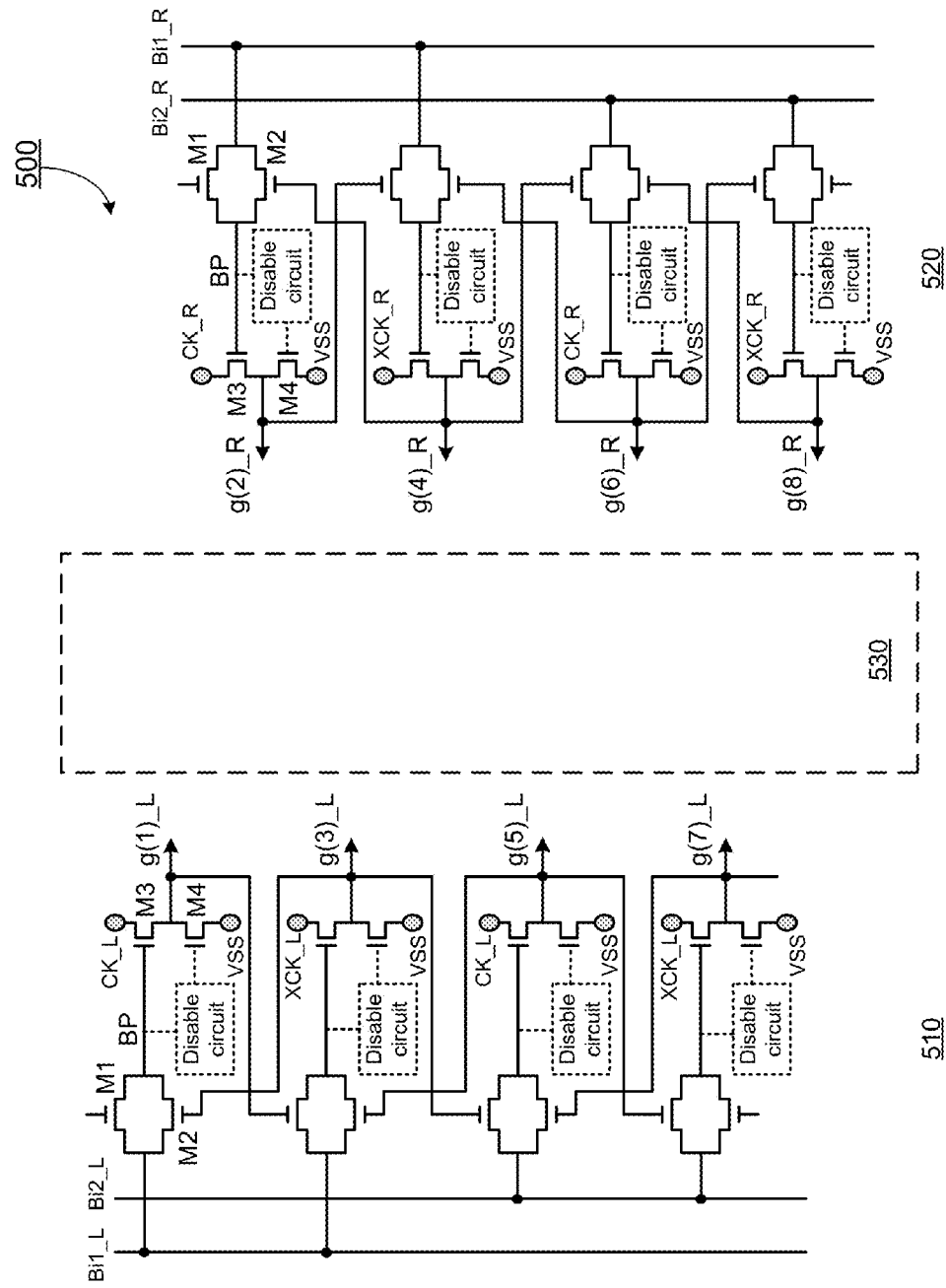
FIG. 5 shows a shift register according to another embodiment of the present invention.
Figure 6:
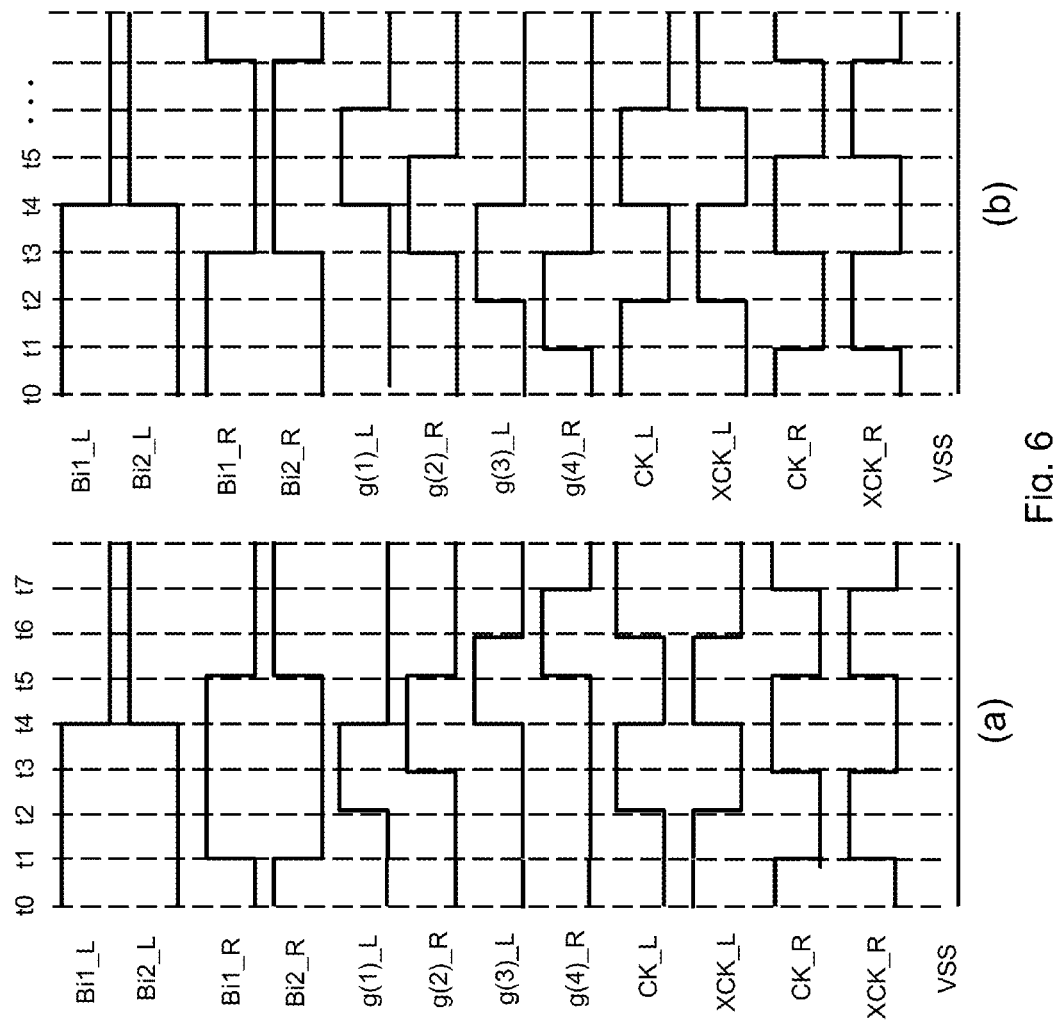
FIG. 6 shows a timing chart of input and output signals of the shift register shown in FIG. 5.
Figure 7:
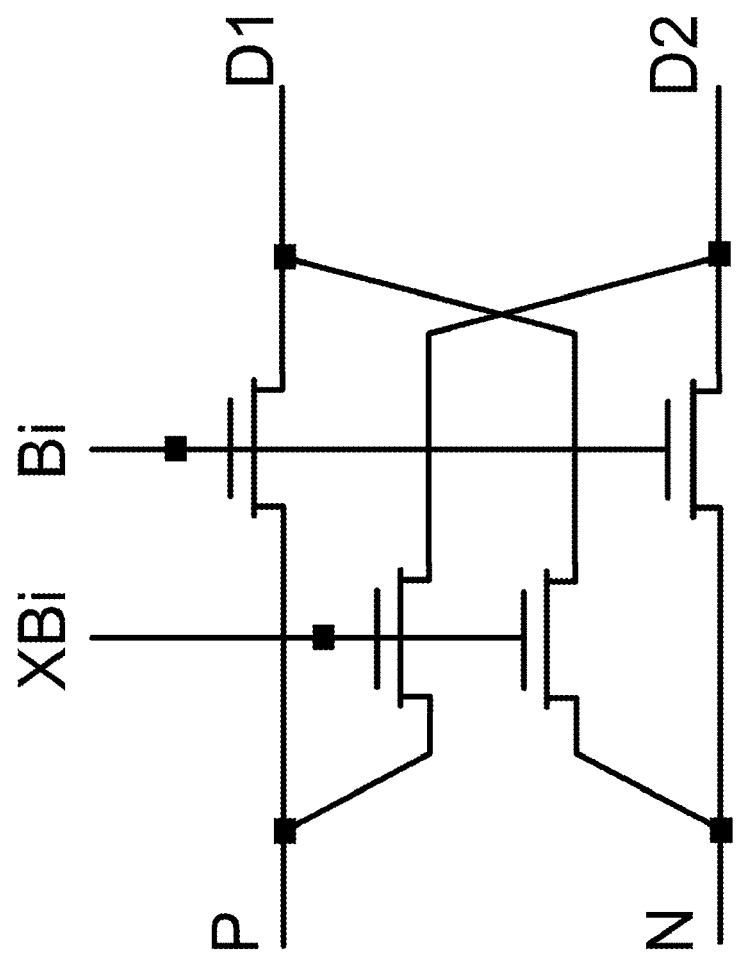
FIG. 7 shows a conventional 2- to-2 bi-directional control circuit.

FIG. 5 shows a shift register 500 according to another embodiment of the present invention. The shift register 500 includes a gate-on-array (GOA) shift register circuit 510 and a second GOA shift register circuit 520, which are formed on the left and right sides, respectively, of a display panel such that a pixel matrix 530 of the display panel is located between the first and second GOA shift register circuits 510 and 520.

Each of the first and second GOA shift register circuits 510 and 520 has the same configuration as that of the shift register 100 shown in FIG. 1 and described above. However, the output signals {g(j)_L} of the first GOA shift register circuit 510 are operably applied to the odd number rows of the pixel matrix 530, respectively, while the output signals {g(j)_R} of the second GOA shift register circuit 520 are operably applied to the even number rows of the pixel matrix 530, respectively.

The first control signal, the second control signal, the first clock signal and the second clock signal applied to the first GOA shift register circuit 510 are denoted by Bi1_L, Bi2_L, CK_L and XCK_L, respectively. The first control signal, the second control signal, the first clock signal and the second clock signal applied to the second GOA shift register circuit 520 are denoted by Bi1_R, Bi2_R, CK_R and XCK_R, respectively. Each of the first control signal Bi1_L/Bi1_R, the second control signal Bi2_L/Bi2_R, the first clock signal CK_L/CK_R and the second clock signal XCK_L/XCK_R is an AC signal characterized with a period and a phase, wherein the periods of the first and second control signals Bi1_L/Bi1_R and Bi2_L/Bi2_R are identical and the phases of the first and second control signals Bi1_L/Bi1_R and Bi2_L/Bi2_R are opposite to each other, wherein the periods of the first and second clock signals CK_L/CK_R and XCK_L/XCK_R are identical and the phases of the first and second clock signals CK_L/CK_R and XCK_L/XCK_R are opposite to each other.

FIGS. 6(a) and 6(b) show the timing charts of the signals of the shift register 500 in the forward function operation and the backward function operation, respectively.

At first a start pulse (Bi1_L) turn on the transistor M1 of first stage at left side and applies a high level voltage to boost point BP. During the time period of (t4-t2) the transistor M1 of the first stage $S_1\_L$ is still turned on because of the voltage level charged in the boost point BP. Accordingly, the output signal g(1)_L of the first stage $S_1\_L$ has a pulse that is corresponding to the pulse of the first clock signal CK_L. Similarly the output signal g(3)_L of the third stage $S_3\_L$ has a pulse that is corresponding to the pulse of the second clock signal XCK_L; and so on. Each of the output pulses, g(1)_L, g(3)_L, g(5)_L, g(7)_L, ..., and g(2N−1)_L is sequentially shifted in the forward shift direction by one clock. At right side the start pulse (Bi1_R) has a π/4 phase delay to left side (Bi1_L), so the output signal g(2)_R of $S_2\_R$ has a pulse rising at the middle point of the g(1)_L pulse and falling at the middle point of the g(3)_L pulse; and so on. Each of the output pulses, g(2)_R, g(4)_R, g(6)_R, g(8)_R, ..., and g(2N)_R is sequentially shifted in the forward shift direction by another one clock. And the output signals of right side stage and left side stage are sequentially shifted alternatively.

In the backward scan mode the start pulse is applied to transistor M1 of stage $S_{2N}\_R$. And according to the same principle the output signals can shift sequentially from g(2N)_R to g(1)_L alternatively by exchange signal Bi1_L with Bi1_R and Bi2_L with Bi2_R.

The present invention, among other things, discloses a shift register having a plurality of stages electrically coupled to each other in series. Each stage includes a first and second TFT transistor. The first TFT transistor has a get electrically coupled to the output of the immediately prior stage, a drain electrically coupled to the boost point of the stage, and a source configured to receive one of the first and second control signals. The second TFT transistor has a get electrically coupled to the output of the immediately next stage, a drain and a source electrically coupled the drain and source of the first transistor, respectively. For such a configuration, the stage can operate in a forward mode or a backward mode by changing the polarity of the first and second control signals. Accordingly, the invented shift register needs no additional 2-to-2 bi-directional control circuit, thereby reducing power consumption and manufacture costs. Additionally, no additional 2- to-2 bi-directional control circuit in the invented shift register causes no voltage drop in the input signals, which makes the signal trigger levels of the shift register higher, therefore operation responses of the shift register faster, and the shift register more reliable.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising:
    (a) a first control line for providing a first control signal, Bi1, and a second control line for providing a second control signal, Bi2, wherein each of the first control signal Bi1 and the second control signal Bi2 is characterized with a period and a phase, the periods of the first and second control signals Bi1 and Bi2 being identical and the phases of the first and second control signals Bi1 and Bi2 being opposite to each other; and
    (b) a plurality of stages, $\{S_j\}$, j=1, 2, ..., N, N being a positive integer, electrically coupled to each other in series, wherein each stage $S_j$ comprises:
        (i) a first transistor M1 having a gate electrically coupled to the immediately prior stage $S_{j-1}$, a drain electrically coupled to a node BP, and a source electrically coupled to the first control signal line or the second control signal line for receiving a corresponding control signal therefrom, respectively; and
        (ii) a second transistor M2 having a gate electrically coupled to the immediately next stage $S_{j+1}$, a drain electrically coupled to the drain of the first transistor M1, and a source electrically coupled to the source of the first transistor M1, respectively.

2. The shift register of claim 1, wherein the source of the first transistor M1 of the stage $S_j$ and the source of the first transistor M1 of the stage $S_{j+1}$ are electrically coupled to one of the first and second control signal lines, while the source of the first transistor M1 of the stage $S_{j+2}$ and the source of the first transistor M1 of the stage $S_{j+3}$ are electrically coupled to the other of the first and second control signal lines.

3. The shift register of claim 1, further comprising:
    (a) a first clock signal line for providing a first clock signal, CK, and a second clock signal line for providing a second clock signal, XCK, wherein each of the first clock signal CK and the second clock signal XCK is characterized with a period and a phase, the periods of the first and second clock signals CK and XCK being identical and the phases of the first and second clock signals CK and XCK being opposite to each other; and
    (b) a reference line for providing a reference voltage, VSS.

4. The shift register of claim 3, wherein each stage $S_j$ further comprises an output for outputting a scanning signal, g(j), and wherein the gate of the first transistor M1 is electrically coupled to the immediately prior stage $S_{j-1}$, and the gate of the second transistor M2 is electrically coupled to the immediately next stage $S_{j+1}$, respectively.

5. The shift register of claim 4, wherein each stage $S_j$ further comprises a third transistor M3 having a gate electrically coupled to the node BP, a drain electrically coupled to the first clock signal line or the second clock signal line for receiving a corresponding clock signal therefrom, and a source electrically coupled to the output, respectively.

6. The shift register of claim 5, wherein the drain of the third transistor M3 of the stage $S_j$ is electrically coupled to one of the first and second clock signal lines when j is an odd number, while the drain of the third transistor M3 of the stage $S_j$ is electrically coupled to the other of the first and second clock signal lines when j is an even number.

7. The shift register of claim 5, wherein each stage $S_j$ further comprises a fourth transistor M4 having a gate, a drain electrically coupled to the source of the third transistor M3, and a source electrically coupled to the reference signal line for receiving the reference voltage VSS therefrom, respectively.

8. The shift register of claim 7, wherein each $S_j$ further comprises a disable circuit electrically coupled between the node BP and the gate of the fourth transistor M4 for operably disabling an output of the stage $S_j$.

9. The shift register of claim 7, wherein each of the first transistor M1, the second transistor M2, the third transistor M3, and the fourth transistor M4 comprises a field-effect thin film transistor.

10. The shift register of claim 3, wherein the periods of the first and second control signals Bi1 and Bi2 are (2*B*T), and the periods of the first and second clock signals CK and XCK are (2*C*T), and wherein T is a pulse width of the scanning signal g(j), and B and C are constants satisfying the relationship of B=2*C.

11. The shift register of claim 10, wherein the first control signal Bi1 and the first clock signal CK have a relative phase that controls input signals to be shifted in a forward or backward direction.

* * * * *